United States Patent [19]
Wagenbrenner et al.

[11] Patent Number: 5,925,210
[45] Date of Patent: Jul. 20, 1999

[54] METHOD FOR MANUFACTURING A COMPOSITE ARRANGEMENT

[75] Inventors: Walter Wagenbrenner, Tamm; Thomas Wiesa, Vaihingen; Ralph Schimitzek, Obersulm/sulzbach, all of Germany

[73] Assignee: Robert Bosch GmbH, Stuttgart, Germany

[21] Appl. No.: 08/803,654

[22] Filed: Feb. 21, 1997

[30]        Foreign Application Priority Data

Feb. 24, 1996  [DE]  Germany ............................ 196 07 014

[51] Int. Cl.⁶ ........................................................ H05K 3/00
[52] U.S. Cl. ........................ 156/306.9; 156/307.3; 156/307.7; 156/309.6; 156/87; 156/276; 156/290; 156/295; 156/537
[58] Field of Search ........................ 156/306.6, 81, 156/87, 90, 155, 156, 276, 283, 285, 286, 290, 291, 295, 296, 306.9, 307.1, 307.3, 307.5, 307.7, 309.6, 313, 324.4, 382, 381, 537

[56]              References Cited

U.S. PATENT DOCUMENTS 2,495,761  1/1950  Platt .......................................... 156/157
3,158,927  12/1964  Saunders .................................... 29/840

FOREIGN PATENT DOCUMENTS

| 42 40 996 | 6/1994 | Germany . |
| 43 07 134 | 9/1994 | Germany . |
| 04056187 | 2/1992 | Japan . |
| 04206675 | 7/1992 | Japan . |
| 04296084 | 10/1992 | Japan . |
| 2 153 595 | 8/1985 | United Kingdom . |

*Primary Examiner*—Francis J. Lorin
*Attorney, Agent, or Firm*—Kenyon & Kenyon

[57]               ABSTRACT

In a method for manufacturing a composite arrangement, at least one printed circuit board substrate is joined with a support under the influence of an applied pressure exerted by a press die over a weave layer (prepreg) impregnated with resin, such that the resin in the region of an opening of the printed circuit board substrate does not flow into this opening. The applied pressure is, therefore, at least partially reduced in the region of the opening of the printed circuit board substrate.

10 Claims, 3 Drawing Sheets

5,925,210

METHOD FOR MANUFACTURING A COMPOSITE ARRANGEMENT

FIELD OF THE INVENTION

The present invention relates to a method for manufacturing a composite arrangement, in particular, at least one printed circuit board substrate being joined with a support under an influence of an applied pressure exerted by a press die over a weave layer (prepreg) impregnated with resin.

BACKGROUND INFORMATION

A method for joining circuit arrangements equipped with electronic components, e.g., printed circuit boards or hybrid elements, is described in German Patent No. 42 40 996. In this method, the circuit arrangements are adhered to the support two-dimensionally using an adhesive agent.

Instead of using an adhesive agent, a circuit arrangement or a printed circuit board substrate can be joined to the support using a weave layer impregnated with resin, a so-called prepreg. A pressure is exerted on the arrangement consisting of the support, prepreg and printed circuit board substrate via a press die, possibly while simultaneously applying heat. In this pressing operation, the resin initially becomes liquified in the prepreg and later hardens to produce a durable adhesive bond.

A disadvantage of the above-described method is that the resin which liquifies during the pressing operation flows in an undefined manner into bore holes, plate-throughs, etc. in the printed circuit board substrate and thereby partially or entirely seals the bore holes, plate-throughs, etc. for later processing of the printed circuit board, e.g., for soldering connecting pins of components to the printed circuit board. In the extreme case, this prevents further processing of the printed circuit board.

An underlying object of the present invention is to improve a method for manufacturing a composite arrangement so that when joining the printed circuit board substrate to the support, no resin can flow in an undefined manner into bore holes, plate-throughs, etc.

SUMMARY OF THE INVENTION

This objective is solved in a method for manufacturing a composite arrangement according to the present invention by at least partially reducing the applied pressure in the region of an opening of the printed circuit board substrate.

The partial or even complete reduction, e.g., taking away, of the applied pressure in the region of an opening of the printed circuit board substrate in the region of a bore hole or a plate-through, has an advantage of the resin in this region flowing less markedly or even not at all due to the reduced or completely removed applied pressure so that in this region an undefined flow into the openings, i.e., bore holes or plate-throughs, cannot occur.

An advantageous embodiment according to the present invention includes providing a recess in the support in the region of the opening and a connection of the recess to the surroundings. Therefore (in the manufacture of the composite arrangement, e.g., the printed circuit board composite construction), the printed circuit board substrate is applied with a lesser pressure to the printed circuit board during the pressing. This is a simple way of preventing the printed circuit board substrate from bonding with the support in the region of the opening. In this manner, no resin can arise that flows into the opening in the region of the opening. The connection to the surroundings is necessary particularly with regard to a later soldering procedure (reflow soldering) at a high temperature. In this case, expansion of the air enclosed in the recess between the printed circuit board substrate and the support occurs. This heated air can escape in an advantageous manner through a connection into the atmosphere.

The actual connection can be produced in numerous manners. For example, a bore hole in the support could be used as the connection. With regard to a rapid escape of the heated air over the shortest route, a ventilation bore hole arranged in the printed circuit board substrate and in the prepreg may be advantageous.

Another advantageous implementation of the method provides that the press die has a cutout in the region of the opening.

Thus, in the region of the opening, no pressure at all is applied to the printed circuit board substrate and to the prepreg located under this as well as to the support so that a resin flow cannot occur in the region of the opening through this construction of the press die, thereby also preventing flow into the opening.

A further advantageous implementation of the method according to the present invention provides that between the press die and the printed circuit board substrate, a press insert is placed that has a recess (cutout) in the region of the opening. Through this recess (cutout) in the press insert also, the pressure exerted on the substrate and thus on the prepreg and the support is significantly or even completely reduced.

The use of such a press insert provided in the region of the opening with a recess (cutout) can also be provided in conjunction with the above-described embodiments of the method according to the present invention since a resin flow is suppressed in an effective manner.

If the use of a press insert is combined in conjunction with the first variant of the method according to the present invention in which in the support in the region of the opening a recess and a connection of the recess to the surroundings are provided, then the recess arranged in the base plate is adapted to the tolerances of the printed circuit board substrate and to the tolerances of the connector pins, connecting wires, etc. to be arranged in the opening.

Yet another embodiment of the method according to the present invention uses a press die that has a cutout in the region of the opening and additionally a recess in the base plate in the region of the opening adapted to the cutout in the press die and a connection of the recess to the surroundings. Through this arrangement, the exertion of pressure in the region of the opening is completely suppressed.

A further embodiment of the method according to the present invention provides that, between the press die and the printed circuit board substrate, a press insert is placed and, additionally, in the base plate in the region of the opening a recess adapted to the cutout in the press die and a connection of the recess to the surroundings are provided. With this embodiment, the applied pressure in the region of the opening is effectively suppressed.

To further improve the two last-mentioned embodiments of the method according to the present invention, in the region of the opening, a cutout is provided in the prepreg. Therefore, a complete suppression of the applied pressure in the region of the opening is achieved.

DETAILED DESCRIPTION

Figure 1:
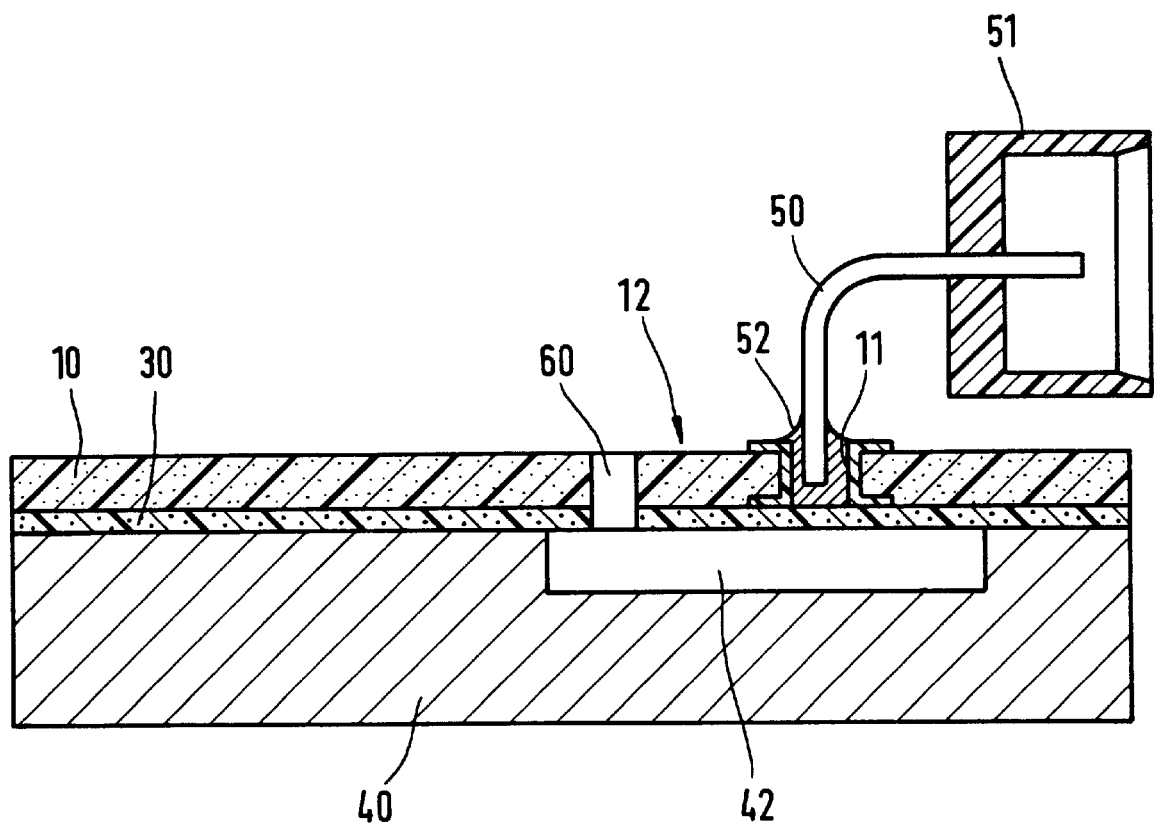
FIG. 1 shows a sectional presentation of a composite arrangement manufactured using an embodiment of the method according to the present invention.
Figure 2:
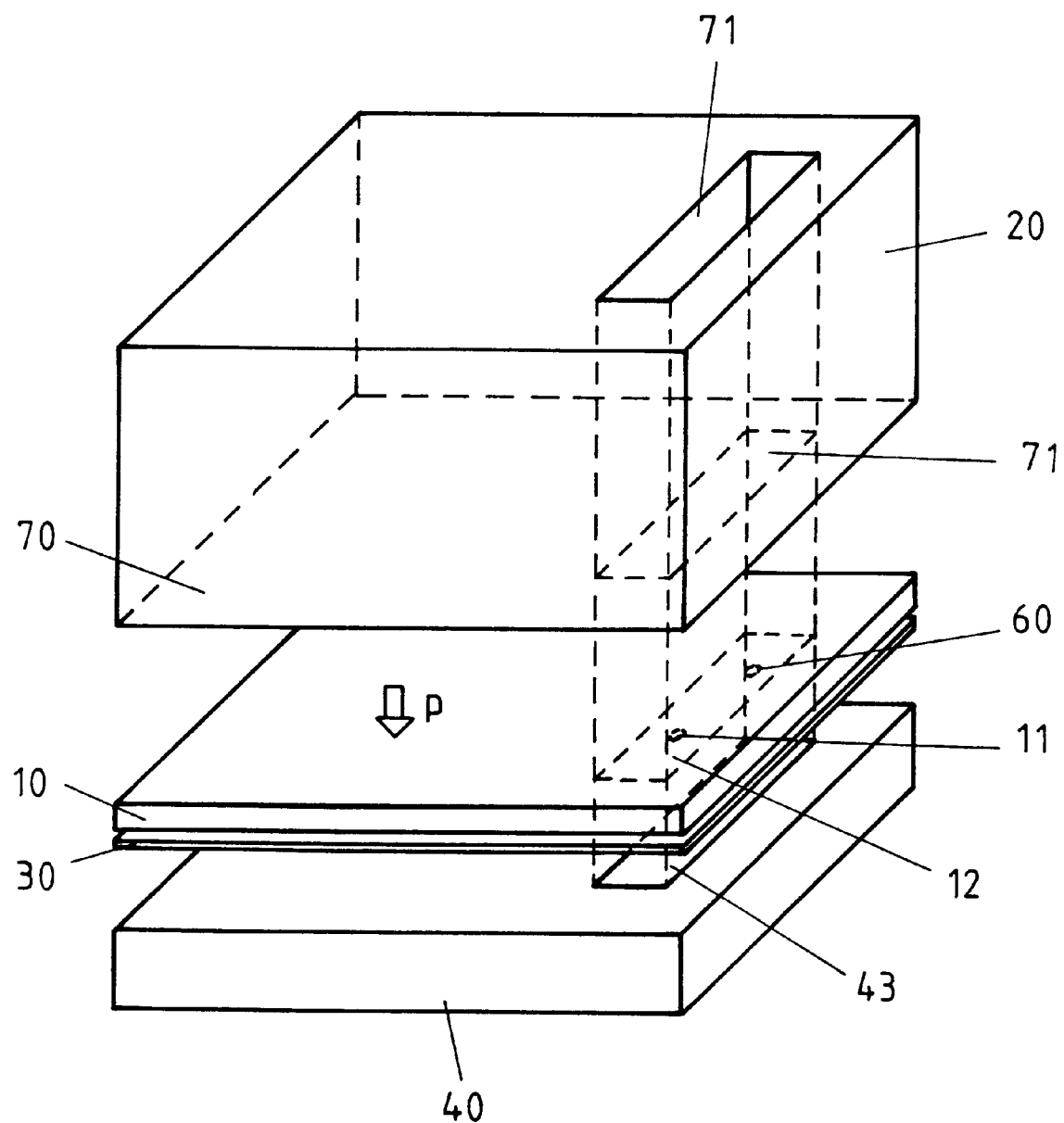
FIG. 2 shows an apparatus for implementing another embodiment of the method according to the present invention.
Figure 3:
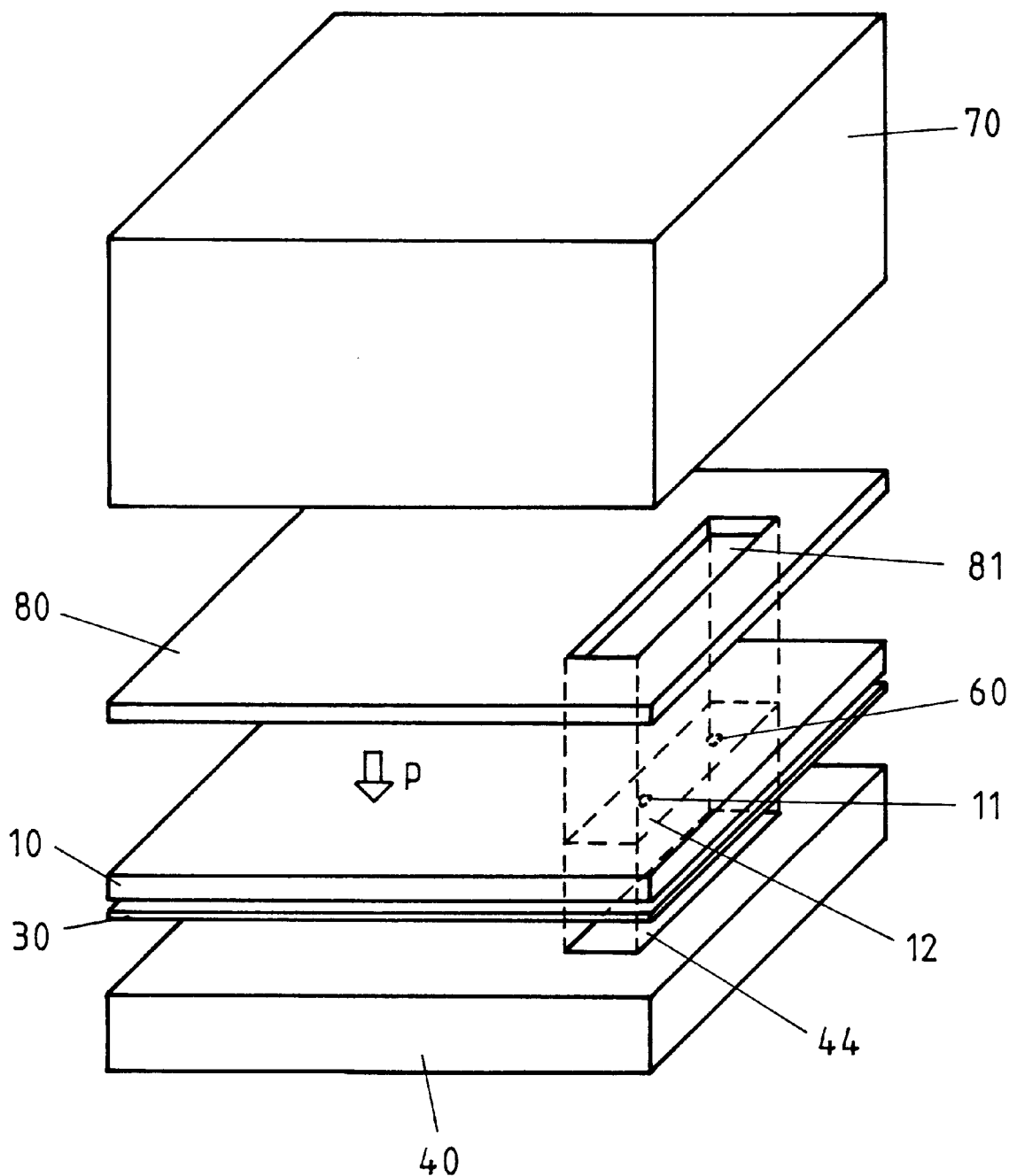
FIG. 3 shows an apparatus for implementing yet another embodiment of the method according to the present invention.

As shown in FIGS. 1–3, a composite arrangement is manufactured by joining a printed circuit board substrate 10 to a support 40 under the influence of an applied pressure p exerted by a press die 20 over a weave layer (prepreg) 30 impregnated with resin. Simultaneous to the exertion of the applied pressure p, heat can be supplied via the press die 20.

Through the exertion of the pressure p on the printed circuit board substrate 10, the resin flows in the prepreg 30 and produces an adhesive bond between the printed circuit board substrate 10 and the support 40, which may consists of metal, for example, of aluminum.

The method according to the present invention is not restricted to the application of a printed circuit board substrate 10 on a support 40, but rather multiple printed circuit board substrates 10 respectively over a prepreg 30 can be secured in a superposed manner on a support 40.

In order to now prevent a resin flow into an opening 11 arranged in the printed circuit board substrate 10, the applied pressure p in the region 12 of the opening 11 is reduced or rather completely removed. This takes place, for example, by providing a recess 42 in the support 40 so that in this region (via the press die 20) a reduced pressure p is exerted since the press die 20 is not opposed by any pressure area in this region next to the printed circuit board substrate 10 and the prepreg 30 (as shown in FIG. 1).

Thus, in region 12 of the opening 11, a resin flow does not occur, nor is the opening 11 blocked. Into this opening 11, as shown in FIG. 1, a contact element such as a connecting wire 50 of a connector 51 can be connected to the printed circuit board substrate 10 in a later process step using reflow soldering using a solder joint 52.

This embodiment of the method for manufacturing a composite arrangement according to the present invention consists of the printed circuit board substrate 10 and support 40. Therefore, air is enclosed in the recess 42 and this air heats up and thus expands during the soldering procedure, a connection to the surroundings in the form of a ventilation bore hole 60 is provided in the printed circuit board substrate 10 and in the prepreg 30 through which the heated and expanding air in the recess 42 can escape when soldering the connecting wire 50.

The pressure p on the printed circuit board substrate 10 in the region 12 of the opening 11 can also be reduced by providing the press die 70 with a cutout 71 in the region 12 of the opening 11, as is shown in FIG. 2. A pressure p being exerted on the printed circuit board substrate 10 is avoided on the prepreg 30. The resin flowing into the opening 11, blocking it and making it inaccessible for subsequent further processing, is also prevented.

In another embodiment of the method according to the present invention, a press insert 80 can be placed between the press die 70 and the printed circuit board substrate 10. The press insert 80 has a recess (cutout) 81 in the region 12 of the opening 11. Through this recess (cutout) 81 arranged in the press insert 80, a pressure p is not exerted on the printed circuit board substrate 10 in the region 12 of the opening 11, which leads to an undesired resin flow.

Additionally to the opening 42 in the support 40, a cutout (not shown) can be provided in the prepreg 30 in the region 12 of the opening 11.

Accordingly, the recess 42 arranged in the support 40 is adapted to the tolerances of the printed circuit board substrate 10 and the tolerances of the connector pins, connecting wires 50, etc. to be arranged in the opening 11.

In a further embodiment of the method according to the present invention, the press die 70 has a cutout 71 in the region of the opening. Additionally, in the support 40 in the region 12 of the opening 11, a recess 43 adapted to the cutout 71 in the press die 70 and a connection of this recess 43 with the surroundings in the form of a ventilation bore hole 60 are provided (as shown in FIG. 2).

Another embodiment of the method according to the present invention provides that between the press die 70 and the printed circuit board substrate 10, the press insert 80, which has the recess (cutout) 81 in the region of the opening 11, is placed. Additionally, in the base plate in the region 12 of the opening 11, a recess 44 that is adapted to the recess (cutout) 81 in the press insert 80 and a connection of the recess 44 with the surroundings in the form of a ventilation bore hole 60 are provided.

Additionally, also respectively in the prepreg 30 a recess (not shown) can be provided that is adapted to the corresponding recesses 43, 44 in the support 40 as well as to the cutout 71 in the press die 70 or rather to the recess (cutout) 81 in the press insert 80.

What is claimed is:

1. A method for manufacturing a composite arrangement, comprising the steps of:

joining at least one printed circuit board substrate with a support member by exerting an applied pressure, the applied pressure being exerted by a press die over a weave layer, the weave layer being impregnated with a resin material;

at least partially reducing the applied pressure in a region of an opening of the at least one printed circuit board substrate, wherein the support member includes a first recess in the support member in the region of the opening; and providing a connection of the first recess to surroundings, wherein the connection includes at least one ventilation bore hole arranged in the at least one printed circuit board substrate and the weave layer.

2. The method accordi ng to claim 1, wherein the press die includes a cutout in the region of the opening.

3. The method according to claim 1, further comprising the step of:

providing a press insert between the press die and the printed circuit board substrate, the press insert having a recess in the region of the opening.

4. The method according to claim 1, further comprising the step of:

providing a cutout in the weave layer, the cutout positioned in the region of the opening.

5. The method according to claim 4, wherein the first recess is adapted to a first tolerance of the at least one printed circuit board substrate and a second tolerance of connecting members, the connecting members arranged in the opening.

6. The method according to claim 1, wherein the press die includes a cutout in the region of the opening, and further comprising the steps of:

providing a second recess in the support member at the region of the opening, the second recess being adapted to the cutout; and providing a connection of the second recess to surroundings.

7. The method according to claim 6, further comprising the step of:

providing the cutout in the weave layer at the region of the opening.

8. The method according to claim 1, further comprising the steps of:

providing a press insert between the press die and the at least one printed circuit board substrate, the press insert including a third recess in the region of the opening;

providing a fourth recess in the support at the region of the opening, the recess being adapted to the third recess in the press die; and providing a connection of the fourth recess to surroundings.

9. The method according to claim 8, further comprising the step of:

providing a cutout in the weave layer at the region of the opening.

10. The method according to claim 1, wherein the weave layer includes a prepreg.

* * * * *